(12) United States Patent
Chen

(10) Patent No.: US 8,166,437 B2
(45) Date of Patent: *Apr. 24, 2012

(54) AUTOMATED PAD RING GENERATION FOR PROGRAMMABLE LOGIC DEVICE IMPLEMENTATION OF INTEGRATED CIRCUIT DESIGN

(75) Inventor: Chih-Ang Chen, Saratoga, CA (US)

(73) Assignee: Apple Inc., Cupertino, CA (US)

(*) Notice: Subject to any disclaimer, the term of this patent is extended or adjusted under 35 U.S.C. 154(b) by 191 days.

This patent is subject to a terminal disclaimer.

(21) Appl. No.: 12/638,164

(22) Filed: Dec. 15, 2009

(65) Prior Publication Data

US 2011/0145778 A1 Jun. 16, 2011

(51) Int. Cl.
*G06F 17/50* (2006.01)

(52) U.S. Cl. ........ 716/117; 716/116; 716/121; 716/128; 716/137

(58) Field of Classification Search .......... 716/116–117, 716/121, 128, 137
See application file for complete search history.

(56) References Cited

U.S. PATENT DOCUMENTS

| | | | |
|---|---|---|---|
| 5,317,210 A * | 5/1994 | Patel ............................ | 326/40 |
| 5,754,826 A * | 5/1998 | Gamal et al. .................. | 703/14 |
| 5,761,484 A | 6/1998 | Agarwal et al. | |
| 5,784,290 A | 7/1998 | Kung et al. | |
| 5,850,537 A | 12/1998 | Selvidge et al. | |
| 5,983,277 A | 11/1999 | Heile et al. | |
| 6,182,247 B1 | 1/2001 | Hermann et al. | |
| 6,285,211 B1 * | 9/2001 | Sample et al. ................. | 326/41 |
| 6,298,319 B1 | 10/2001 | Heile et al. | |
| 6,414,513 B1 | 7/2002 | Hanna et al. | |
| 6,460,148 B2 | 10/2002 | Veenstra et al. | |
| 6,530,073 B2 | 3/2003 | Morgan | |
| 6,754,763 B2 | 6/2004 | Lin | |
| 6,785,873 B1 | 8/2004 | Tseng | |
| 6,826,717 B1 | 11/2004 | Draper et al. | |
| 7,007,248 B2 * | 2/2006 | Blinne et al. .................. | 716/102 |
| 7,188,330 B2 * | 3/2007 | Goyal ........................... | 716/104 |
| 7,480,610 B2 | 1/2009 | Scott et al. | |
| 7,512,728 B2 | 3/2009 | Tseng | |
| 7,644,382 B2 * | 1/2010 | Budumuru .................... | 716/106 |
| 2004/0194048 A1 | 9/2004 | Arnold | |
| 2005/0165995 A1 | 7/2005 | Gemelli et al. | |
| 2006/0206850 A1 | 9/2006 | McCubbrey | |

(Continued)

OTHER PUBLICATIONS

U.S. Appl. No. 12/638,152, filed Dec. 15, 2009.

(Continued)

*Primary Examiner* — Naum Levin

(74) *Attorney, Agent, or Firm* — Lawrence J. Merkel; Meyertons, Hood, Kivlin, Kowert & Goetzel, P.C.; Jason L. Burgess

(57) ABSTRACT

In an embodiment, a method to automatically generate a pad ring for a programmable logic device implementation of an integrated circuit is contemplated. The pad ring that will be used in the integrated circuit itself may include pad logic (e.g. to support boundary scan and other forms of testing), custom driver/receiver circuitry, etc. The pad ring in the programmable logic device, on the other hand, may be predetermined as part of the production of the programmable logic device. The generation may include removing the pad logic and other pad-related circuitry from one or more design files that represent the integrated circuit, as well as mapping the input, output, and input/output signals of the integrated circuit to the available programmable logic device pads.

12 Claims, 12 Drawing Sheets

U.S. PATENT DOCUMENTS

| | | | |
|---|---|---|---|
| 2007/0271537 A1* | 11/2007 | Budumuru | 716/5 |
| 2008/0077904 A1 | 3/2008 | Soejima et al. | |
| 2008/0228970 A1 | 9/2008 | Schneider et al. | |
| 2008/0313589 A1* | 12/2008 | Maixner et al. | 716/6 |
| 2009/0055787 A1* | 2/2009 | Oh et al. | 716/6 |
| 2010/0057417 A1* | 3/2010 | Hudson et al. | 703/7 |
| 2011/0145778 A1 | 6/2011 | Chen | |
| 2011/0145779 A1* | 6/2011 | Chen | 716/137 |
| 2011/0145781 A1* | 6/2011 | Chen et al. | 716/137 |

OTHER PUBLICATIONS

U.S. Appl. No. 12/638,172, filed Dec. 15, 2009.

U.S. Appl. No. 12/638,178, filed Dec. 15, 2009.

* cited by examiner

| Command | Arg1 | Arg2 | Description |
|---|---|---|---|
| BYP | vpath | port | Decouple 'vpath' and connect to 'port' at top |
| NCP | parent | ports | Disconnect 'ports' on module 'parent' |
| RMI | module | instance | Remove 'instance' of 'module' |
| MVT | vpath | | Move 'vpath' module to top |
| DLP | exp | | Delete ports at top that match 'exp' |
| TIE | vpath1 | vpath2 | Connect 'vpath1' to 'vpath2' |
| INP | ports | | Delete top level ports not in 'ports' |
| ADM | module | ports | Add 'module' and connect 'ports' |

('Command', 'Arg1', 'Arg2')

('BYP', 'top/mod1/mod3/i4', 'gi6')

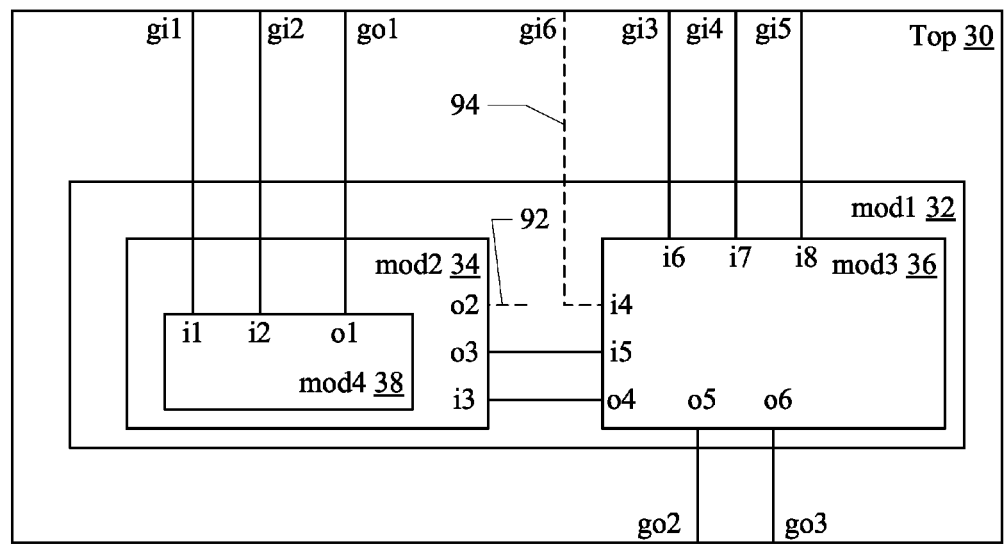

Fig. 6

Pad Ring Config 60
Type, out, Pad, in, oe, msb, lsb
INPUT,,pad_name,input_name,,0,0
OUTPUT,output_name,pad_name,,,0,0
INOUT,output_name,pad_name,input_name,oe_name,0,0

DELETE, core2pad_UART6_RTSN

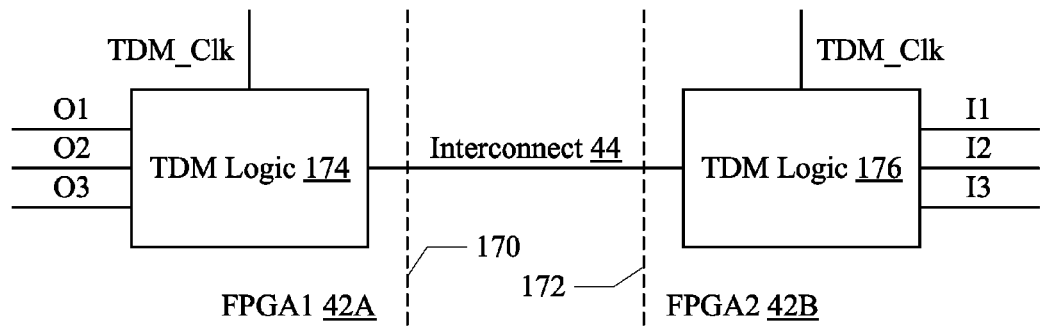
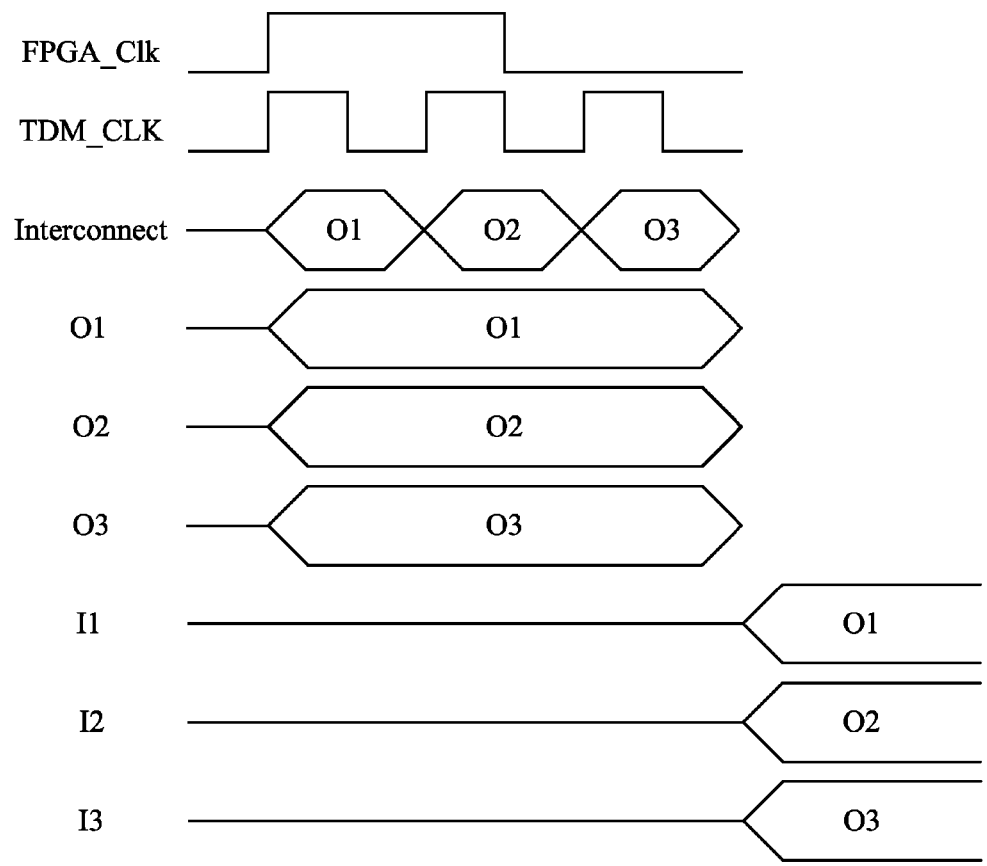
Fig. 15

AUTOMATED PAD RING GENERATION FOR PROGRAMMABLE LOGIC DEVICE IMPLEMENTATION OF INTEGRATED CIRCUIT DESIGN

BACKGROUND

1. Field of the Invention

This invention is related to the field of integrated circuit design and, more particularly, to implementing an integrated circuit design in one or more programmable logic devices.

2. Description of the Related Art

Integrated circuit design and testing continues to grow in complexity as the complexity of the integrated circuit itself increases. With every new generation of integrated circuit fabrication technology, the number of transistors that can be included on a given integrated circuit chip increases, which further contributes to the increased complexity.

A programmable logic device implementation of all or portions of an integrated circuit design is one option that can be used during the development of an integrated circuit. Programmable logic device implementations typically operate at higher speeds than software simulations, permitting more extensive testing and/or more complex testing. For example, running the actual boot software that is planned for use with the integrated circuit can be feasible in a programmable logic device implementation. The programmable logic device implementation can be used to detect various software bugs and/or issues between the software and the hardware at an earlier stage of the development.

Generally, the design files that describe the integrated circuit design at a high level, such as a register-transfer level (RTL), require modification to be used for the programmable logic device implementation. Additionally, various other modifications and additional information is used to implement the design in a programmable logic device. The designers of the integrated circuit and/or verification engineers that work with the designers must generally perform these modifications and additions manually. The process is error-prone and often results in lost time determining why the programmable logic device implementation is not working. Additionally, much of the work must be repeated, again manually, when new versions of the integrated circuit design are provided for programmable logic device implementation.

SUMMARY

In an embodiment, a method to automatically generate a pad ring for a programmable logic device implementation of an integrated circuit is contemplated. The pad ring that will be used in the integrated circuit itself may include pad logic (e.g. to support boundary scan and other forms of testing), custom driver/receiver circuitry, etc. The pad ring in the programmable logic device, on the other hand, may be predetermined as part of the production of the programmable logic device. The pad ring generation may include removing the pad logic and other pad-related circuitry from one or more design files that represent the integrated circuit, as well as mapping the input, output, and input/output signals of the integrated circuit to the available programmable logic device pads.

BRIEF DESCRIPTION OF THE DRAWINGS

The following detailed description makes reference to the accompanying drawings, which are now briefly described.

FIG. 5 is a table illustrating one embodiment of a set of commands supported in an engineering change order (ECO) language.

FIG. 6 is a block diagram of one embodiment of the design files shown in FIG. 2 illustrating one embodiment of the bypass command shown in FIG. 5.

FIG. 15 is a block diagram and a timing diagram illustrating one embodiment of pin multiplexing.

Figure 1:
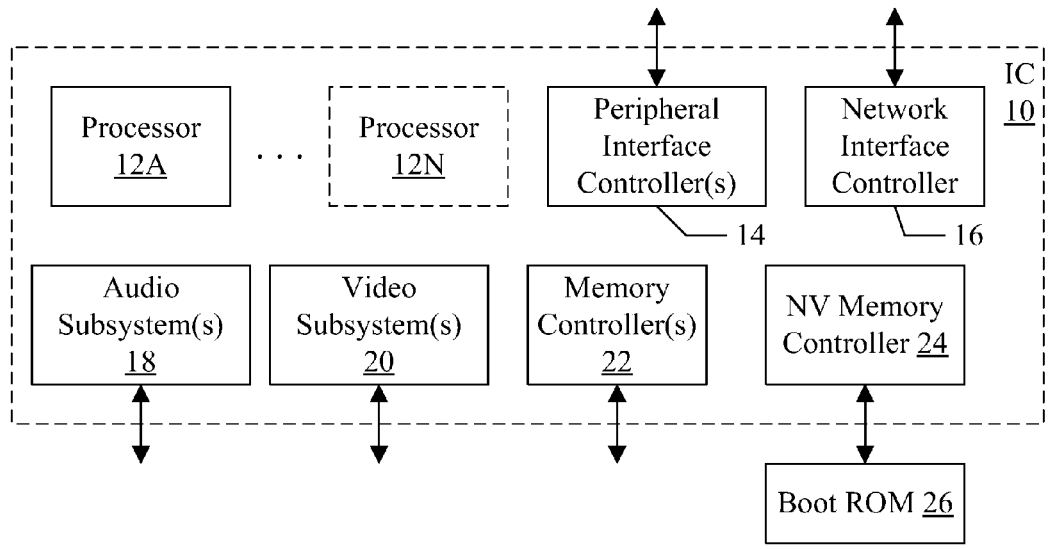
FIG. 1 is a block diagram of one embodiment of an integrated circuit.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits and/or memory storing program instructions executable to implement the operation. The memory can include volatile memory such as static or dynamic random access memory and/or nonvolatile memory such as optical or magnetic disk storage, flash memory, programmable read-only memories, etc. Similarly, various units/ circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/ component.

DETAILED DESCRIPTION OF EMBODIMENTS

HDL Design File to Programmable Logic Device Methodology Overview

As mentioned above, the design of an integrated circuit may be described in one or more design files, using an HDL. Exemplary HDLs that may be used in various embodiments include Verilog, VHDL, etc. Generally, HDLs may support the description of the integrated circuit at a high level (e.g. as logic equations) that may be convenient for human generation and consumption. In one embodiment, the design descriptions may be register-transfer level (RTL) descriptions expressed in an HDL. The description in the design files, when taken as a whole, describe the integrated circuit. The division into multiple design files may provide for convenient editing and change tracking. For example, each component of the integrated circuit may be represented by one or more design files.

The design files may be processed in a variety of ways. For example, the design files may be compiled to a variety of target platforms for testing and/or may be synthesized to produced integrated circuit hardware. The target platforms may include a simulation platform as well as the programmable logic device (PLD) platform described in detail herein. A specific PLD example used in this description is field programmable gate array (FPGA). More generally, however, a PLD may be any electronic component that is reconfigurable to implement different hardware operation. Exemplary PLDs may include FPGAs, programmable array logic (PAL), complex PLDs, Flash devices, various programmable ROMs, etc. The FPGA environment will be used as an example herein, but any PLD may be used in other embodiments.

Exemplary Integrated Circuit

To illustrate the HDL design file to FPGA implementation methodology, an exemplary integrated circuit is shown in FIG. 1. However, any integrated circuit, implementing any desired set of components, may be used with the methodology described herein.

Turning now to FIG. 1, a block diagram of one exemplary embodiment of an integrated circuit (IC) 10 is shown. In the illustrated embodiment, the integrated circuit 10 may include at least one processor 12A, and may optionally include additional processors such as processor 12N. In the illustrated embodiment, the integrated circuit 10 may be an SOC including various peripheral circuitry such as one or more peripheral interface controller(s) 14, one or more network interface controllers 16, one or more audio subsystems 18, one or more video subsystems 20, one or more memory controllers 22, and/or one or more non-volatile (NV) memory controllers such as NV memory controller 24. The NV memory controller 24 may be coupled to a boot read-only memory (ROM) 26 that is not included in the IC 10, in the illustrated embodiment. It is noted that other embodiments may include any subset of the components shown in FIG. 1, or any superset of the components shown and other components, or any subset of the components and other components, as desired. Specifically, in one embodiment, the boot ROM 26 may be included in the IC 10 with the other components.

The components 12A-12N, 14, 16, 18, 20, 22, and 24 may be coupled in any desired fashion, not shown in FIG. 1. For example, one or more buses, point-to-point links, etc. may be used to couple the components. Generally, a component may refer to any block of circuitry having a defined functionality, interface to other components, and software interface (as appropriate).

The processors 12A-12N may be configured to execute the instructions defined in the instruction set architecture implemented by the processors. Any instruction set architecture may be used in various embodiments. In some embodiments, one or more of the processors 12A-12N may implement different instruction set architectures, or different versions of the same instruction set architecture. The processors 12A-12N may include circuitry and, in some cases, may include microcode. Generally, a processor may be integrated with other components in an integrated circuit (e.g. as shown in FIG. 1), may be a discrete microprocessor, and/or may be included with one or more other components in a multi-chip module implementation, in various embodiments.

The peripheral interface controllers 14 may be configured to serve as a bridge between the components and one or more peripheral interfaces to which devices may be coupled. Peripheral interfaces may include, for example, peripheral component interconnect (PCI), PCI Express (PCIe), Institute for Electrical and Electronic Engineers (IEEE) 1394 or "Firewire", universal serial bus (USB), HyperTransport, etc. The network interface controllers 16 may be configured to communicate between the components and devices coupled to one or more network interfaces. The network interfaces may include Ethernet, asynchronous transfer mode (ATM), token ring, etc. The audio subsystem 18 may be configured to process audio data, and may communicate with audio input/ output devices such as a microphone, speakers, headphones, etc. The video subsystem 20 may be configured to process video data, and may communicate with video input/output devices such as display screens, cameras, etc. The memory controllers 22 may be configured to communicate with external memory, such as various forms of volatile memory (e.g. static random access memory (SRAM), dynamic random access memory (DRAM), synchronous DRAM (SDRAM), double data rate (DDR, DDR2, DDR3, etc.) SDRAM, low-power DDR (LPDDR2) SDRAM, RAMBUS DRAM, etc. The memory controllers 22 may be coupled to one or more DRAM chips, or may be coupled to one or more memory modules comprising circuit boards to which one or more DRAM chips are mounted.

The NV memory controller 24 may be configured to communicate with one or more non-volatile memory devices such at the boot ROM 26. Generally, a non-volatile memory device may be any memory device that is designed to retain data stored in the memory device when the power to the memory device is removed. For example, a ROM may be a non-volatile memory device. Other non-volatile memory devices may include Flash memory, programmable ROMs of various types, battery-backed SRAM, etc. While a ROM will be used as an example in the remainder of this discussion for storing the boot code, any non-volatile memory may be used.

The boot ROM 26 may store boot code for the IC 10. When the IC 10 is powered on, the boot code may be executed to test the various components of the IC 10 and/or to initialize the components for use. That is, one or more of the processors 12A-12N may execute the boot code stored in the boot ROM 26.

It is noted that, while FIG. 1 illustrates components integrated onto a single semiconductor substrate as the integrated circuit 10, other embodiments may implement discrete components and/or combinations of discrete components and integrated components in a system. Any amount of discrete components or integration may be used. The integrated circuit 10 will be used as an example below, but any system of components may be used in other embodiments. As mentioned previously, the boot ROM 26 may be included in the integrated circuit 10, in some embodiments.

Hierarchical Design Files

Figure 2:
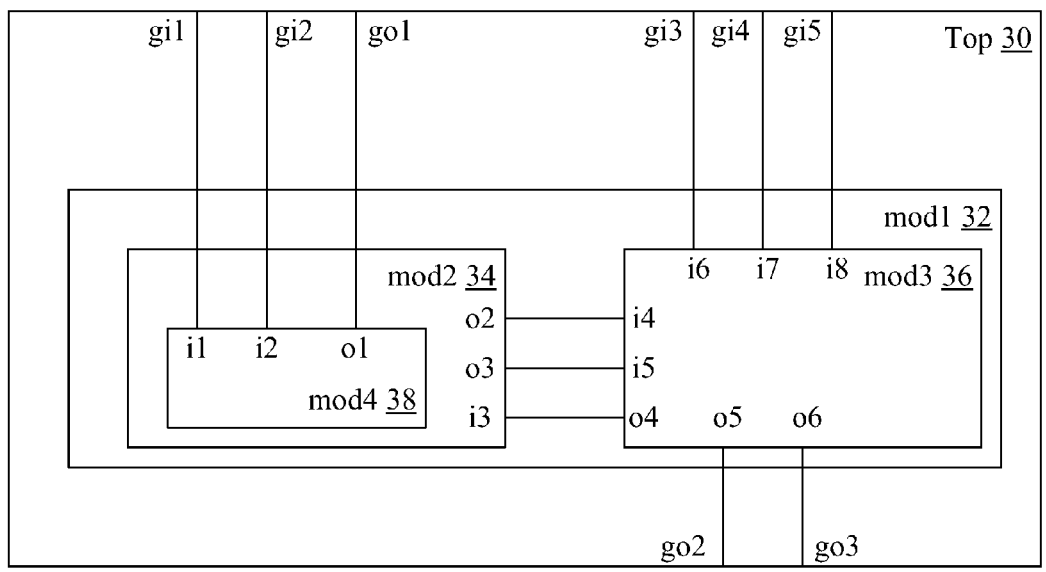
FIG. 2 is a block diagram illustrating one embodiment of design files for at least a portion of the integrated circuit shown in FIG. 1.

Turning now to FIG. 2, a block diagram illustrating one embodiment of a portion of the integrated circuit design for the integrated circuit 10 is shown, illustrating a hierarchical design that may be represented in one or more design files using HDL. In the illustrated embodiment, there is a top level module ("top") 30 that includes a module ("mod1") 32, which includes two modules ("mod2" and "mod3") 34 and 36. The mod2 module 34 includes a module ("mod4") 38. Each module 30-38 may be stored in a separate design file, and the hierarchy may be created by instantiating one module in the design file of the other module. For example, the design file for the top module 30 may instantiate the mod1 module 32. The design file for the mod1 module 32 may instantiate the modules 34 and 36, etc.

Each design file may specify input and output signals for the module, and may specify any module instantiations within the module. The module instantiations may include a list of inputs and outputs of the instantiated module, connecting the inputs and outputs to signal names within the instantiating module (either inputs and outputs of the instantiating module, signals generated internal to the instantiating module, or signals from another module instantiated within the instantiating module). Additionally, each design file may include HDL code describing various circuitry within the module as well.

Accordingly, the design files may define a hierarchical structure. The "top" level of the hierarchy may be the highest level. That is, the top level is not instantiated as a module in any other design files. The top level may correspond to the chip (e.g. the IC 10). In some embodiments, a top level may be defined for portions of the IC 10, e.g. for testing purposes. For example, there may be a top level module for each of the components of the IC 10 shown in FIG. 1, to permit simulation of the components in isolation.

The top module 30 may correspond to the integrated circuit 10 as a whole. The mod1 module 32 may be an instantiation of the one of the components of the integrated circuit 10 (e.g. the processor 12A). The mod2 and mod3 modules may be portions of the component (e.g. a decode unit, execution units, etc.). The mod4 module may be an even lower level subcomponent (e.g. an adder in an execution unit). Any number of levels of hierarchy may be supported, in an embodiment.

In the embodiment of FIG. 2, the top module 30 may define inputs gi1, gi2, gi3, gi4, and gi5 and outputs go1, go2, and go3. The inputs and outputs of the top module 30 may correspond to chip inputs and outputs for the integrated circuit 10, and thus are labeled with a "g" for "global" in FIG. 2. In the illustrated embodiment, all of the inputs gi1 to gi5 and outputs go1 to go3 are also inputs and outputs of the mod1 module 32. There may be other top module 30 inputs and outputs for other modules instantiated in the top module 30 (not shown in FIG. 2). The mod2 module 34 has gi1 and gi2 as inputs and go1 as an output. More particularly, the gi1 and gi2 inputs and the go1 output are inputs/outputs of the mod4 module 38 (coupled to the i1, i2, and o1 inputs/outputs as shown in FIG. 2). The mod3 module 36 has the inputs gi3, gi4, and gi5 as inputs (i6, i7, and i8 in FIG. 2) and go2 and go3 as outputs (o5 and o6 in FIG. 2). Additionally, the mod2 module 34 has outputs o2 and o3 and input i3 coupled to inputs i4 and i5 and output o4 of the mod3 module 36. It is noted that the intermediate levels of modules may have input and output signal names as well.

The inputs and outputs of a module may be referred to as "ports". A port may be a connection point for a module. It may be input, output, or input/output for bi-directional signals.

FPGA Board

Figure 3:
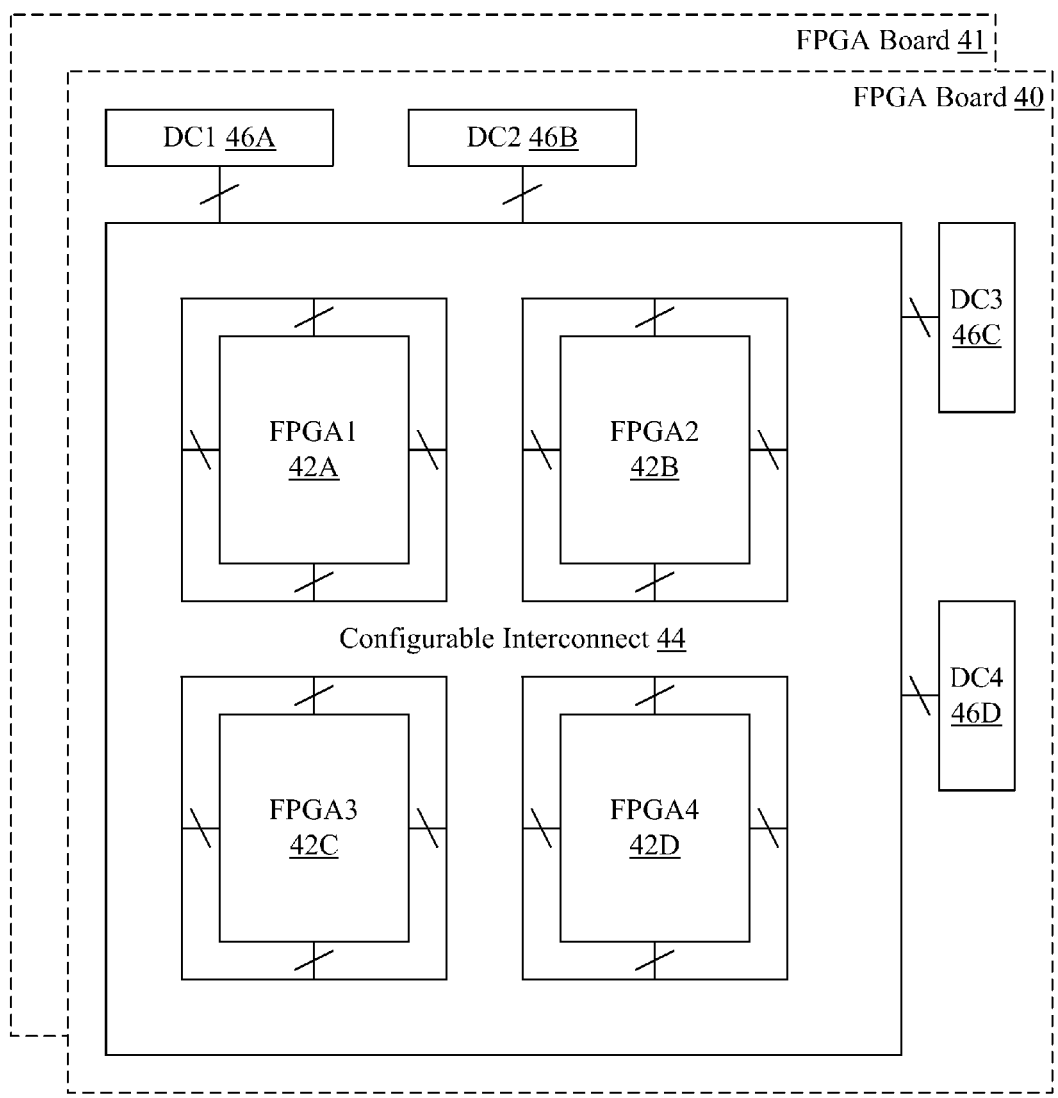
FIG. 3 is a block diagram of one embodiment of a field programmable gate array (FPGA) board.

Turning next to FIG. 3, a block diagram of one embodiment of an FPGA board 40 is shown. The FPGA board 40 may be programmed with a bitstream to be an FPGA implementation of the integrated circuit 10 or a portion thereof. In the illustrated embodiment, the FPGA board 40 includes multiple FPGAs 42A-42D. Any number of FPGAs may be included on a board in various embodiments. Various pins of the FPGAs 42A-42D may be coupled to a configurable interconnect 44, which may be programmed by the bitstream to connect pins of one FPGA 42A-42D to pins of another FPGA 42A-42D. The configurable interconnect 44 may also couple FPGA pins to pins of a daughter card connector such as connectors 46A-46D. There may be any number of daughter card connectors in other embodiments, and there need not be the same number of daughter card connectors as FPGAs. The physical locations of the FPGA devices 42A-42D and the daughter card connectors 46A-46D on the FPGA board 40 may be varied as well in other embodiments.

The daughter card connectors 46A-46D may be configured to connect to daughter cards, which may implement functionality that may not be implemented in the FPGAs 42A-42D. For example, the FPGAs 42A-42D may be digital devices, and thus analog circuitry such as phase locked loop circuitry, physical (PHY) layer circuitry, etc. may be implemented on daughter cards. Additionally, common (e.g. off the shelf) circuitry may be implemented on daughter cards to avoid consuming FPGA circuitry space with such circuitry. Such common circuitry may include industry standard input/output circuitry such as serial or parallel communications, Universal Serial Bus, Peripheral Component Interconnect, etc. In some embodiments, the daughter cards may include additional FPGA devices. The daughter cards may be manufactured by the manufacturer of the FPGA board 40, or may be custom designed by the designers of the integrated circuit 10, in various embodiments.

In some embodiments, there may be more than one FPGA board. For example, in FIG. 3, a second FPGA board 41 is shown underneath the FPGA board 40. The FPGA boards may be stackable. In one embodiment, daughter card connectors 46A-46D may also be used to connect between FPGA boards. Alternatively or in addition, other connectors may be provided to connect between boards. For example, flexible connector cables such as ribbon cables may be used to connect between boards. Any combination of fixed and flexible connectors of any types may be used in various embodiments. The methodology described herein may be used in any such configuration. For example, the connections between boards may be handled in a similar fashion to daughter card pin assignments.

As mentioned above, the bitstream may include the programming for the FPGAs 42A-42D and for the configurable interconnect 44. The bitstream may be downloaded to the FPGA board 40 using a software tool provided by the manufacturer of the FPGA board 40, for example. There may be separate bitstreams for each FPGA 42A-42D and the configurable interconnect 44, or there may be one combined bitstream, in various embodiments.

HDL Design File to FPGA Methodology

Figure 4:
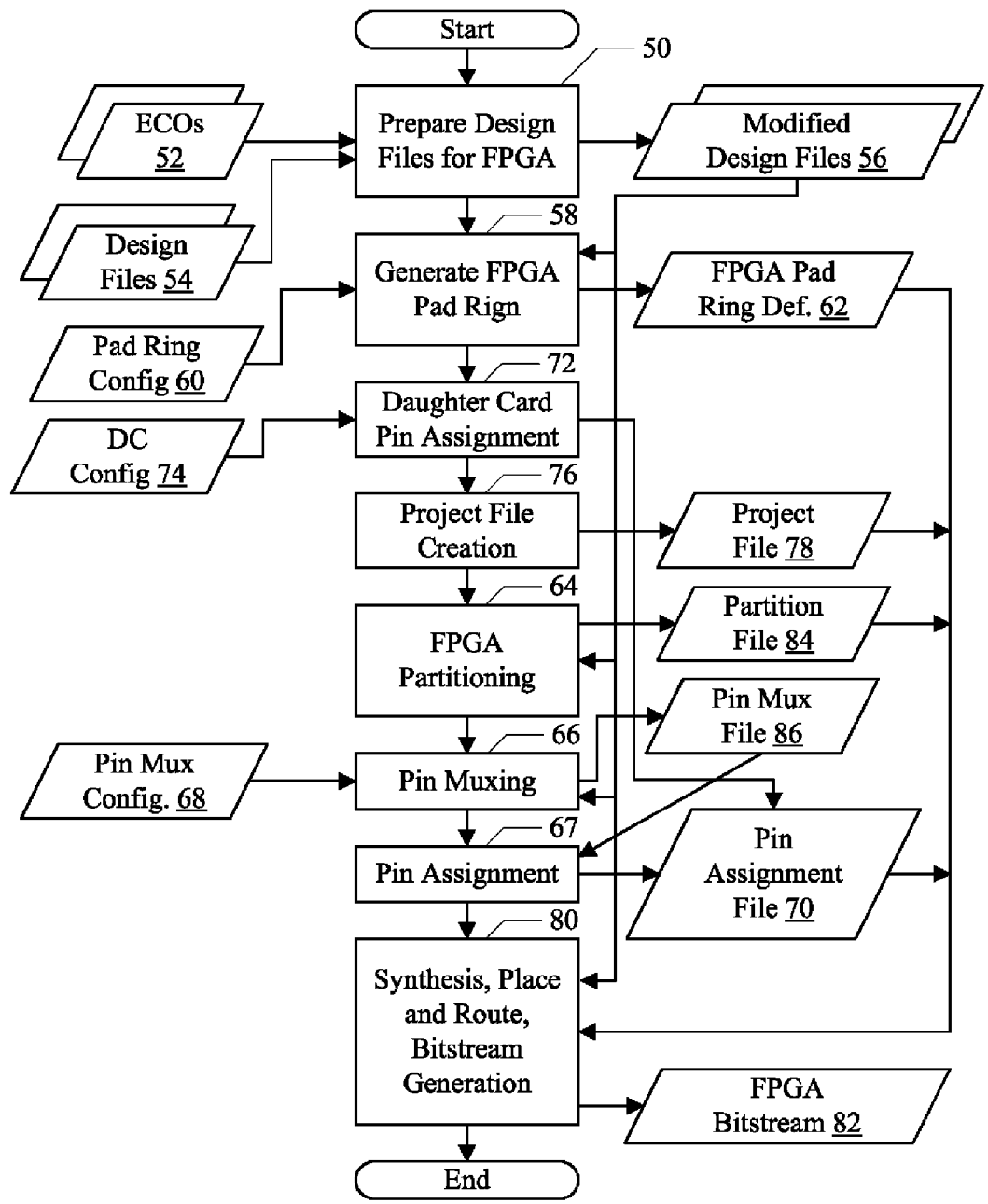
FIG. 4 is a flowchart illustrating one embodiment of a methodology for implementing an integrated circuit design on one or more programmable logic devices.

Turning now to FIG. 4, a flowchart is shown illustrating one embodiment of a methodology to generate an FPGA implementation of the IC 10 (or a portion thereof). While the blocks are shown in a particular order in FIG. 4 for ease of understanding, other orders may be used. Blocks may be performed in parallel as well. In an embodiment, FPGA generation code may be executed on a computer to implement all or a portion of the flowchart in FIG. 4. The FPGA generation code may be one program, or may be a collection of programs that may be executed to implement the flowchart. The instructions forming the FPGA generation code may be binary instructions directly executable on one or more hardware processors of the computer, and/or may include one or more scripts that may be executed in a software environment. That is, the scripts may be commands that are interpreted by a command shell environment that performs specified operations in response to the commands. Any combination of instruction types may be used in various embodiment. The instructions, when executed, may implement the operation shown in FIG. 4.

The methodology may include preparing the design files 54 for FPGA implementation (block 50). A variety of modifications may be performed to the design files to support an FPGA implementation. For example, as mentioned above, the FPGA devices are digital devices and thus analog circuitry may be removed from the design files for replacement by a daughter card implementation. Additionally, some signals may be bypassed to the top module 30. For example, clock signals may be bypassed in such a fashion. Additionally, while a given IC 10 may include multiple clock domains (at least some of which may operate at different frequencies during use), FPGA implementations may often reduce the number of clock domains. Clock bypassing may be part of reducing the number of clock domains. Other signals may not be used, or may be disconnected. For example, if an FPGA implementation of a portion of the IC 10 is being generated, signals that communicate with components that are not included in the FPGA implementation may be disconnected (or tied to another signal or a constant value). The modified design files 56 may be produced by applying the commands in the ECO files 52 to the design files 54.

Rather than manual modification of the design files, the FPGA generation code may automatically modify the design files based on a set of engineering change order (ECO) files 52. The ECO files 52 may include various commands recognized by the FPGA generation code as specifying certain modifications. An exemplary set of commands and the operation of the FPGA generate code are discussed in more detail below. By avoiding manual modifications, in one embodiment, the errors that may often be introduced via manual modification may be avoided. Furthermore, the ECO files 52 may serve to document the changes, so that later releases of the design files (e.g. that have been updated with bug fixes, new features, etc.) may have the same changes made without the designer needing to remember the changes that were made in previous iterations of the design file. The designer may update the ECO files 52 with additional changes if needed.

In one embodiment, there may be one ECO file 52 for each design file 54. In another embodiment, there may be one ECO file 52 for each design file 54 and each different FPGA implementation that may be created for a given IC 10. That is, if multiple different portions of the IC 10 may be implemented in the FPGAs for testing, the modifications to a design file that is included in more than one of the implementations may differ for the different implementations.

The methodology may also include FPGA pad ring generation (block 58). A pad ring of the IC 10 may generally include the pads on the IC, driver and/or receiver circuitry, and optional pad logic. The pads may be part of the IC, and may be the points at which electrical connection to the IC package pins are made. The pad logic may include logic that supports testing (e.g. boundary scan testing, NAND tree testing, etc.). On the other hand, the FPGA devices 42A-42D may include a preconfigured pad ring with input, output, and input/output types. Accordingly, generating the FPGA implementation may include mapping the IC's input, output, and input/output signals to the available pad types in the FPGA devices. The FPGA pad ring generation may include automatically identifying IC pads and mapping them to FPGA pads. A default naming convention may be assumed, and the FPGA generation code may search the modified design files 56 for the default names. Additionally, for cases in which non-default names are used, the FPGA generation code may include support for a pad ring configuration file 60. The pad ring configuration file 60 may specify signal names for input, output, and input/output signals that do not follow the naming convention. The FPGA generation code may generate an FPGA pad ring definition 62 as a result of the pad ring generation. Additional details of one embodiment of the FPGA pad ring definition are provided below.

The methodology may further include daughter card pin assignment (block 72). The user may determine which of the daughter card connectors 46A-46D have daughter cards that are used by the FPGA implementation, and may prepare an daughter card (DC) configuration file 74 that specifies which daughter card is in which connector 46A-46D. The pins of the connectors 46A-46D and their connection to the FPGA board 40 may be fixed, and thus the FPGA generation code may be able to determine the configuration of the configurable interconnect 44 that may be needed to connect a portion of the IC design to the daughter card connector, once the location of the daughter card is known. The daughter cards may implement various circuitry. For example, any analog circuitry that was extracted from the design files 54 that is implemented on a daughter card may indicate that the daughter card is used. Based on the location of the daughter card and the FPGA device(s) that include the circuitry that interfaces to the circuitry implemented on the daughter card, additional interconnect 44 configuration may be determined. The FPGA generation code may write the daughter card pin assignments to a pin assignment file 70 (along with other pin assignments described below).

The methodology may further include the creation of a project file (block 76). The FPGA generation code may generate the project file 78, which may specify the files to be used by the synthesis, place and route, and bitstream generation tools to generate the bitstream to program the FPGA board 40. For example, the project file 78 may include the locations of the modified design files 56, the FPGA pad ring definition file 62, the pin assignment file 70, a partition file 84 (described below), and various other files that may be used to generate the bitstream.

Based on the modified design files 56, the methodology may include partitioning the implementation into the FPGA devices (block 64). The partitioning may take into account the number of signals that are connected between the modules of the design, attempting to reduce the number of signals which need to be communicated between FPGA devices. The FPGA generation code may write a partition file 84 that describes the partitioning (e.g. which HDL files, or portions thereof, are partitioned to which FPGA device).

The methodology may further include pin multiplexing (muxing) (block 66) and pin assignment (block 67) for the pins on the FPGA devices. Even if the partitioning attempts to reduce the number of signals that are communicated between FPGA devices, there may still be a large number of signals to be communicated. Time division multiplexing the signals over the available pins may be one mechanism for overcoming this issue.

The FPGA generation code may receive an input pin mux configuration file 68, which may specify various constraints for the pin muxing operation, such as the ratio of the time division multiplex clock (which controls the driving of the signals on the FPGA pins) to the clock that controls the internal operation of the FPGA devices. The ratio may control the maximum number of signals that can be muxed on a given pin (i.e. the maximum number may not exceed the ratio). The constraints may also include a list of clocks (defining corresponding clock domains), lists of signals that may or may not be muxed (e.g. generated from commercially available FPGA tools), etc.

The pin muxing/assignment implemented in the FPGA generation code may include clock domain tracing on the signals that are outputs from a FPGA device, to identify the clock domain(s) to which the signal belongs. Generally, a clock domain may refer to the circuitry that is controlled by a given clock signal. The clocked storage devices in the clock domain may be controlled by the clock signal. Accordingly, for a given signal, the clock domain tracing may include searching for the clocked storage devices in the cone of logic that generates the given signal. The clocks that control the clocked storage devices may be identified. The FPGA generation code may associate each identified clock domain with the signal.

The clock domains for the given signals may be compared by the FPGA generation code, and signals that have matching clock domains may be grouped for possible pin muxing. That is, the pin muxing/assignment may include muxing signals that have matching clock domains. Clock domains may match for a pair of signals if the same clock or clocks are identified for the pair of signals. Additionally, in some embodiments, clock domains may match if equivalent clocks are identified for the pair of signals. Clocks may be equivalent if they are known to be generated in-phase and at the same frequency for any mode of operation of the integrated circuit 10. Additional details for one embodiment of pin muxing are provided below.

The FPGA generation code may select signals from a given clock domain group for muxing (block 66) and may assigned the selected signals to a pin (block 67). The pin assignment may take into account the source/destination of the signals in other FPGA devices and the degree of configurability of the interconnect 44 to ensure that the FPGA device pins may be connected. The resulting pin assignment file 70 may be written by the FPGA generation code. The FPGA generation code may also write a pin mux file 86 with the groups of signals that have been selected for muxing on each pin, as a result of the pin muxing block 66.

The methodology may further include the "back end" processing (block 80) to generate the FPGA bitstream 82. The FPGA generation code may invoke one or more commercially available tools to perform the synthesis of the modified design files, place and route the synthesized designs to the configurable logic blocks within the FPGA devices 42A-42D, and generate the bitstream for each FPGA device 42A-42D and the configurable interconnect 44.

Design File Modification

Turning next to FIGS. 5-11, an exemplary set of commands that may be supported for modifying the design files 54 to generate the modified design files 56 is shown. The commands may be stored in the ECO files 52, as mentioned previously. The embodiment illustrated in FIGS. 5-11 is one implementation, and other implementations may be used in other embodiments. For example, any subset of the commands shown in FIG. 5 and/or superset of the commands shown in FIG. 5 and/or other commands may be implemented.

FIG. 5 is a table 90 illustrating one embodiment of the commands. Below the table 90, an exemplary format for the commands is shown. In the exemplary format, a command begins with an open parenthesis, the command between single quotes, a comma, the first argument of the command between single quotes, another comma, the second argument of the command (if any) between single quotes, and a closing parenthesis. Some arguments may support multiple values. Such arguments may be specified with an open parenthesis, a comma-delimited, single-quoted list of values, and a close parenthesis, in one embodiment. Other embodiments may use any other format, different delimiters, fewer delimiters (e.g. the single quotes may be eliminated, or the commas may be eliminated), etc.

In the table 90, arguments may have various forms. A vpath may be a (potentially hierarchical) path name to a port or a module instance. A port may be a port name. Ports may be a port name, or a list of ports. A parent may be a hierarchical path to a parent module of a given module or port. A module may be a module name. An instance may be an instance name for a module. An exp may be an expression, which may use wildcards and other expression variables that may be evaluated by the FPGA generation code to determine a corresponding list of matches (e.g. matching ports, in the case of the DLP command).

FIGS. 6-10 use the example design files of FIG. 2 to illustrate operation of the FPGA generation code in response to various commands. As the commands are described, the examples will be discussed in turn.

The bypass (BYP) command may be used to bypass a signal (wire) at any point in the hierarchy to a port at the top level of the hierarchy. For example, clock signals may be bypassed from local clock generation circuitry to the top level, where a global clock may be connected. The number of clock domains in the FPGA implementation may thus be reduced to simplify the FPGA implementation. Other signals may be bypassed as well (e.g. signals that communicate with analog circuitry that is extracted from a design file). FIG. 6 is a block diagram illustrating an example of the bypass command for the structure illustrated in FIG. 2. The first argument of the bypass command, 'top/mod1/mod3/i4', specifies the i4 port on the mod3 module 36. Accordingly, the existing connection 92 to the o2 port of the mod2 module 34 is disconnected, and the i4 port is connected to the port specified as the second argument of the bypass command (gi6), see connection 94 in FIG. 6. While a new port gi6 is specified in this example, other embodiments may connect to an existing top level port as well.

Figure 7:
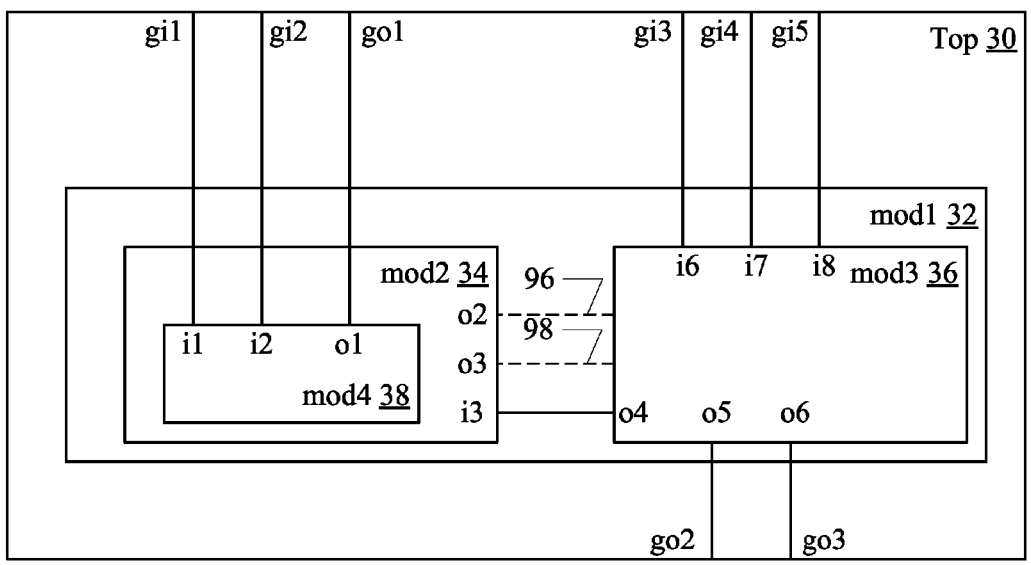
FIG. 7 is a block diagram of one embodiment of the design files shown in FIG. 2 illustrating one embodiment of the no-connect port command shown in FIG. 5.

The no-connect port (NCP) command may be used to remove the connection of one or more ports of a module. FIG. 7 is a block diagram illustrating an example of the no-connect port command for the structure of FIG. 2. In the example, the no-connect port command specifies that the i4 and i5 ports of the mod3 module are not connected. This is illustrated by the disconnections 96 and 98 in FIG. 7.

The remove module instance (RMI) command may be used to remove a module from the design files. The module operand may specify the module from which an instance of an included module is to be removed, and the instance may be the module name of the included module instance to be removed. The RMI command may be used to remove modules that may be replaced by dummy modules in the FPGA implementation, for example.

Figure 8:
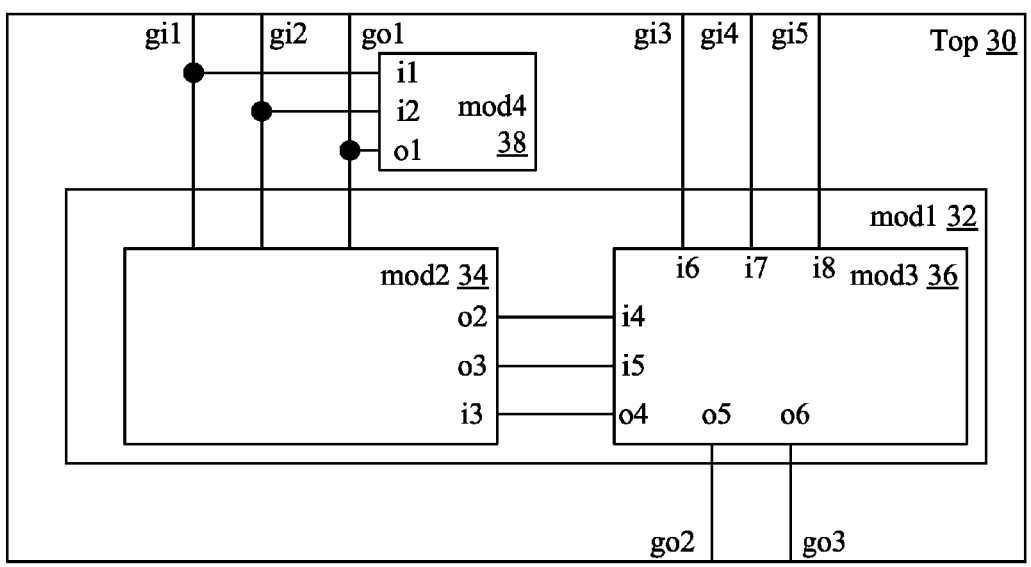
FIG. 8 is a block diagram of one embodiment of the design files shown in FIG. 2 illustrating one embodiment of the move to top command shown in FIG. 5.

The move to top (MVT) command may be used to move a module identified by the vpath operand to the top level of the design files. The MVT command may be used as part of the extraction of a module (e.g. an analog module) from the FPGA implementation. The module may be moved to the top, and then may be replaced by a daughter card, for example. The MVT keeps the module connected to its input/output ports. For example FIG. 8 illustrates the use of the MVT command to move the mod4 module 38 to the top module 30. As illustrated in FIG. 8, the mod4 module 38 is removed from the mod2 module 34, but remains connected to the gi1, gi2, and go1 ports. The FPGA generation code may include the addition and/or deletion of ports to ensure that connectivity to the module remains in place when the module is moved to the top module 30.

Figure 9:
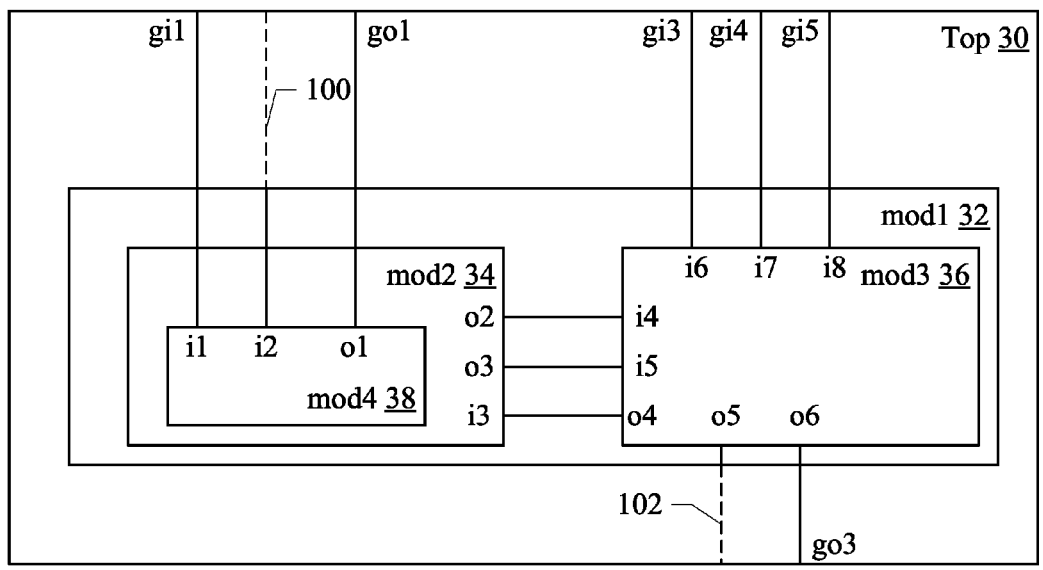
FIG. 9 is a block diagram of one embodiment of the design files shown in FIG. 2 illustrating one embodiment of the delete port or include port commands shown in FIG. 5.

The delete ports (DLP) command may be used to delete one or more ports at the top module 30. When processing the DLP command, the FPGA generation code may disconnect the ports at the top module 30 without modifying internal connections within the design files. Thus, for example, FIG. 9 illustrates the DLP command to delete top level ports that end in "2". In this example, the deleted ports are gi2 and go2 (disconnections 100 and 102). However, connections corresponding to these ports (e.g. within the mod1 module 32 and mod2 module 34) remain after the DLP command has been processed. The include ports (INP) command may be the opposite of the DLP command. That is, the FPGA generate code may retain the ports specified by the INP command and delete ports that are not specified. In FIG. 9, the corresponding INP command that has the same effect as the DLP command is shown.

Figure 10:
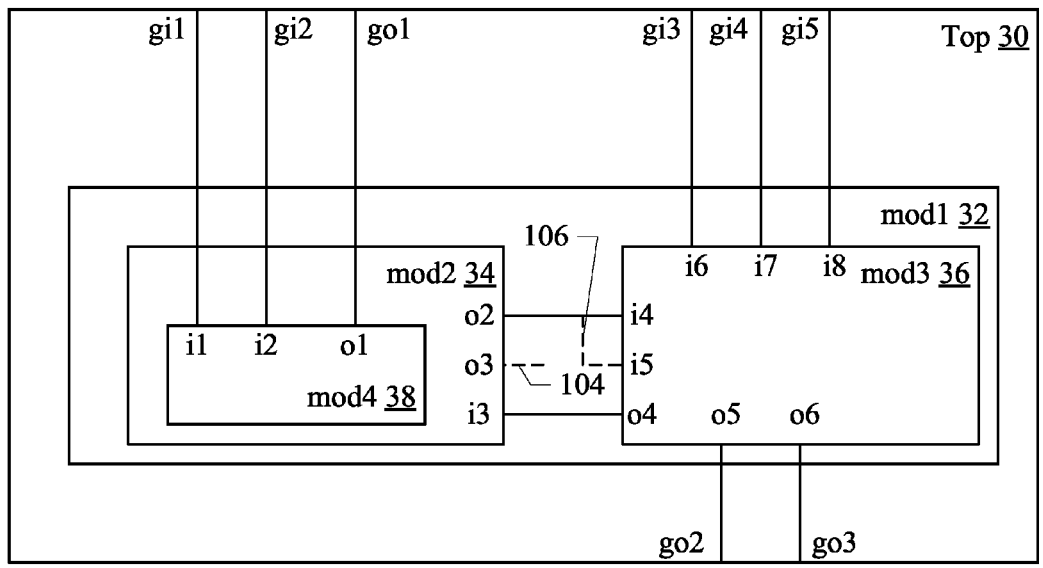
FIG. 10 is a block diagram of one embodiment of the design files shown in FIG. 2 illustrating one embodiment of the tie command shown in FIG. 5.

The tie (TIE) command may be used to tie a given signal (vpath1) to another signal (vpath2). The current connection of the first signal (vpath1) may be broken and tied to the second signal (vpath2). To tie a signal high or low, a binary 1 or binary 0 may be used as the vpath2 operand. FIG. 10 is an example of the tie command, tying the i5 port of the mod3 module 36 to the o2 port of the mod2 module 34. Thus, the i5 port of the mod3 module 36 is disconnected from the o3 port of the mod2 module 34 (reference numeral 104) and is connected to the o2 port of the mod2 module 34 (reference numeral 106).

The add module (ADM) command may be used to insert a module into the structure and to connect its ports as specified in the ports operand. The add module command may be used, e.g., to add a dummy module in place of a module removed using the RMI command.

Figure 11:
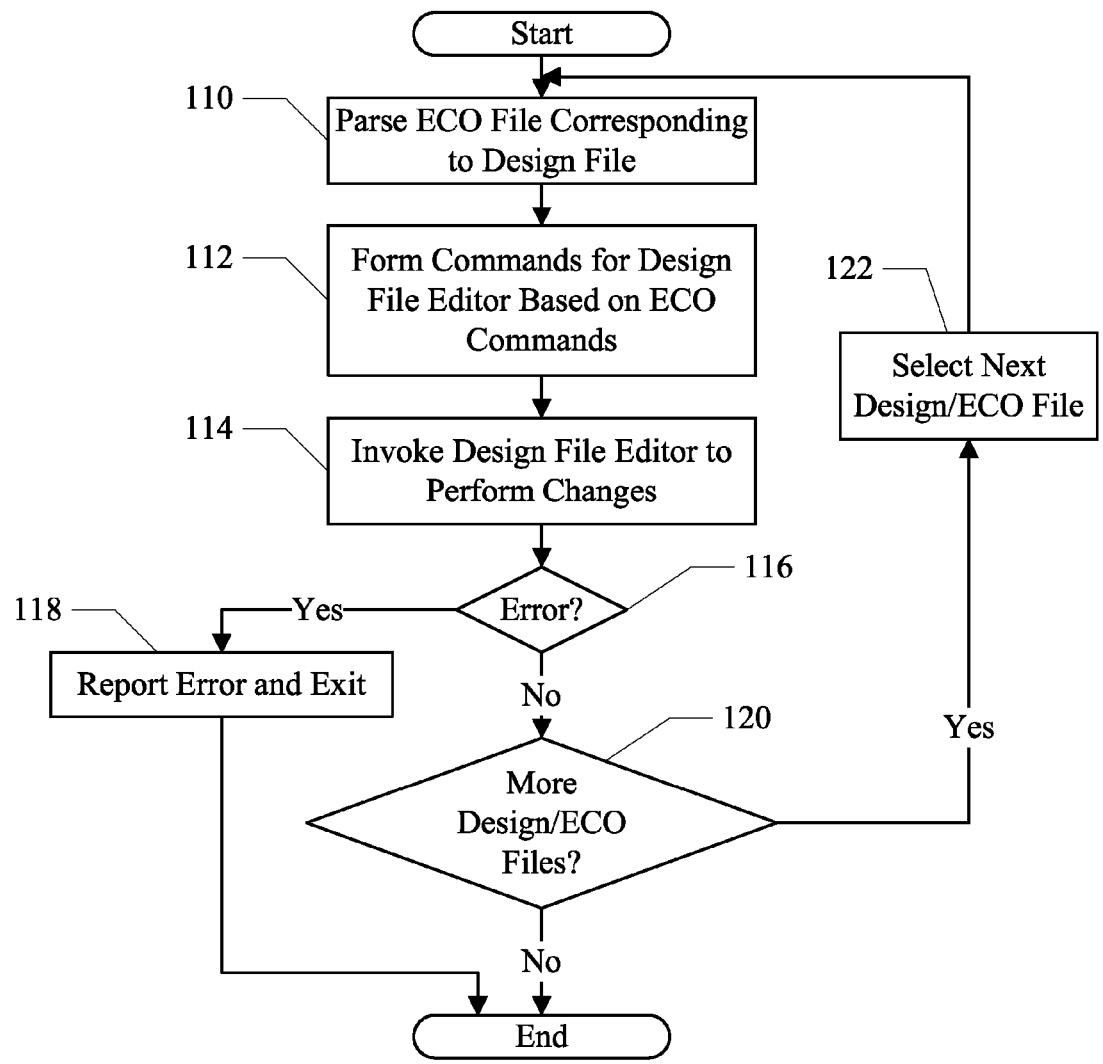
FIG. 11 is a flowchart illustrating operation of one embodiment of FPGA generation code operating upon ECO commands and corresponding design files.

FIG. 11 is a flowchart illustrating operation of one embodiment of the FPGA generation code to automatically perform the modifications to a set of design files 54 as specified by corresponding ECO files 52 to generate the modified design files 56. While the blocks are shown in a particular order in FIG. 11 for ease of understanding, other orders may be used. Blocks may be performed in parallel as well. In an embodiment, FPGA generation code may be executed on a computer to implement all or a portion of the flowchart in FIG. 11. The instructions forming the FPGA generation code (or a portion thereof that implements the flowchart of FIG. 11) may be binary instructions directly executable on one or more hardware processors of the computer, and/or may include one or more scripts that may be executed in a software environment. That is, the scripts may be commands that are interpreted by a command shell environment that performs specified operations in response to the commands. Any combination of instruction types may be used in various embodiment. The instructions, when executed, may implement the operation shown in FIG. 11.

The FPGA generation code may parse the ECO file 52 that corresponds to a given design file 54 (block 110), detecting each command in the ECO file 52. The FPGA generate code may form commands for a design file editor tool based on the commands in the ECO file (block 112). An exemplary design file editor tool may be ChipMason, available from ChipEDA, San Jose, Calif. Any other design file editor tool may be used. Additionally, any text editor may be used in other embodiments. Still further, other embodiments may perform the edits directly.

The FPGA generation code may invoke the design file editor to perform the commands (block 114). If the design file editor reports an error attempting to perform the commands (decision block 116, "yes" leg), the FPGA generation code may report the error to the user and exit (block 118). If no error is detected (decision block 116, "no" leg), and there are more design files 54 and corresponding ECO files 52 to process (decision block 120, "yes" leg), the FPGA generation code may select the next design file 54/ECO file 52 to be processed (block 122) and may repeat the blocks shown in FIG. 11 for the selected files. If each design file 54 and corresponding ECO file 52 has been processed (decision block 120, "no" leg), the ECO processing is complete.

Pad Ring Generation

Figure 12:
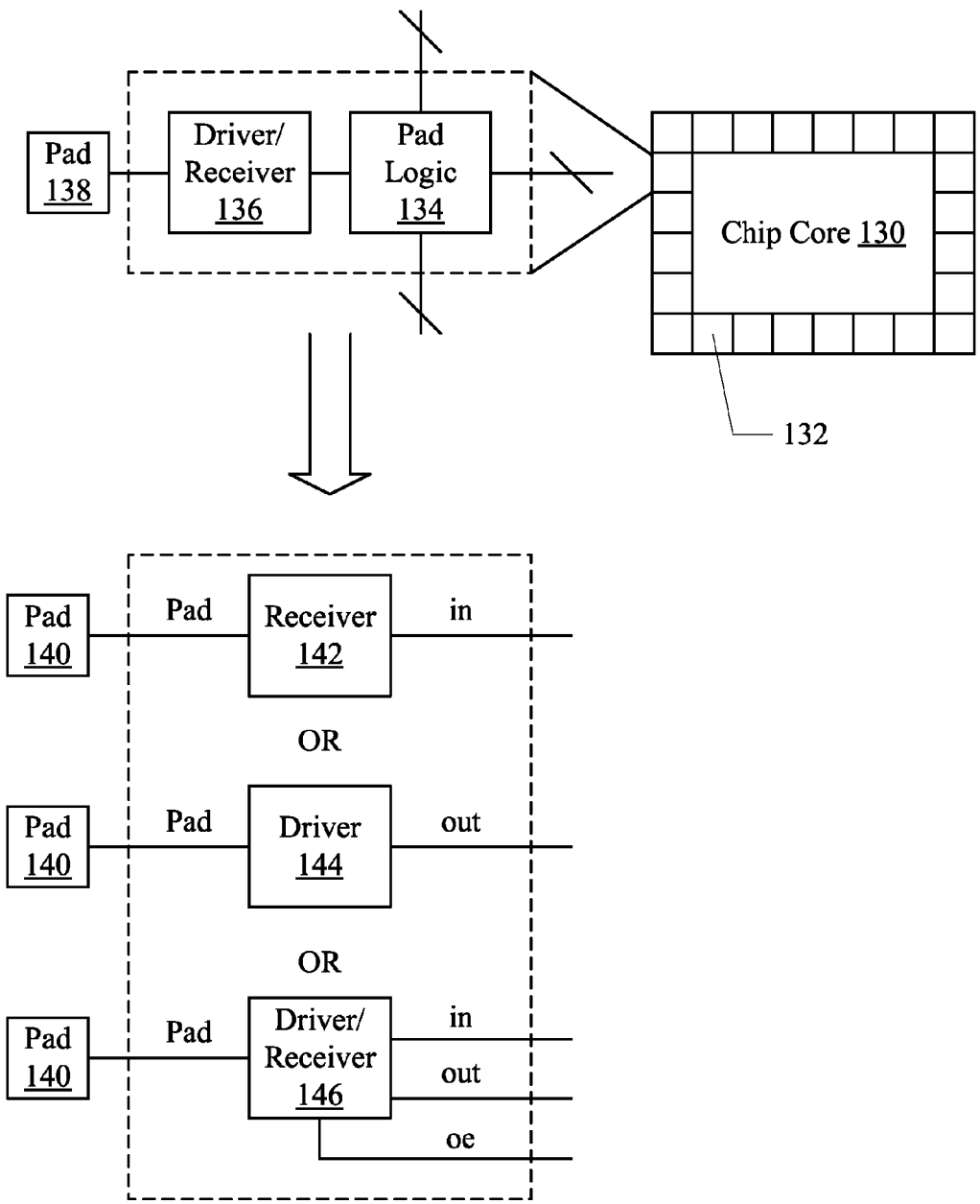
FIG. 12 is a block diagram illustrating integrated circuit pad circuitry and FPGA pad circuitry.

Turning now to FIG. 12, a block diagram of one embodiment of a chip core 130 and pad ring 132, and corresponding pad ring circuitry for an integrated circuit and an FPGA for an embodiment. In FIG. 12, the pad ring circuitry for the integrated circuit includes pad logic 134, a driver and/or receiver 136, and the pad 138 itself. The pad logic 134 may be coupled to various signals from the chip core 130, and may also be coupled to various signals from pad logic in adjacent pads (vertical lines in FIG. 12). The pad logic 134 may be coupled to the driver/receiver 136, which may be coupled to the pad 138. Also illustrated in FIG. 12 are the types of FPGA pad ring circuits, for one embodiment. In the illustrated embodiment, the FPGA supports three types of pad ring circuits: an input circuit, an output circuit, and a bidirectional input/output circuit. Each circuit may be coupled to a pad 140 of the FPGA. The input circuit include a receiver 142. The output circuit includes a driver 144. The input/output circuit includes a driver/receiver 146.

The pad logic 134 may include various test logic, such as boundary scan test logic, NAND tree test logic, etc. The test logic may not be needed in the FPGA implementation, and thus may be removed. The pad logic 134 may also include selection circuitry to control the signals communicated between the chip core 130 and the pad 138 for pin repurposing. Pin repurposing may involve using the same pin of the integrated circuit for different functions at different points in time. For example, during power up or reset, pins may be used to transmit various signals to indicate integrated circuit capabilities and/or to receive various signals to program features of the integrated circuit. During normal operation, the pins may be used as part of the integrated circuit's interface to communicate with other components of a system. Pin repurposing may often not be needed in the FPGA implementation, and may also be removed. Alternatively, if the pin repurposing is needed, additional pins may be allocated for the different purposes.

The driver/receiver circuitry 136 may include custom driver/receiver circuitry. For example, if the integrated circuit is designed for use in a high voltage environment (e.g. the voltages on the pins are higher than the voltages internal to the chip core 130), the driver/receiver circuitry may include cascode transistor configurations or other high voltage configurations.

The FPGA devices 42A-42D may be preconfigured with various numbers of the input, output, and input/output circuits. The internal circuitry of the FPGA devices 42A-42D may be programmably connected to the input, output, and input/output circuits via the bitstream to realize the desired communication. The input circuit may include a pad signal ("Pad" in FIG. 12) and an input signal ("in" in FIG. 12). The pad signal and the input signal may be coupled to the receiver 142. The output circuit may include the pad signal and an output signal ("out" in FIG. 12), both of which may be coupled to the driver circuit 144. The input/output circuit may include the pad signal, the input signal, and the output signal as well as an output enable ("oe" in FIG. 12), all coupled to the driver/receiver circuit 146. If the output enable is asserted, the output signal may be driven on the pad signal by the driver/receiver circuit 146. If the output enable is deasserted, the pad signal may be received on the input signal by the driver/receiver circuit 146.

The FPGA generation code may be configured to remove the integrated circuit pad ring and to generate a corresponding FPGA pad ring using the FPGA pad circuits shown in FIG. 12. The signals provided between the chip core 130 and the pad logic 134 may include the input, output, and output enable signals used by the FPGA pad circuits, buy may also include various test signals and other signals specific to the pad logic 134 and/or the driver/receiver circuit 136. Accordingly, generating the FPGA pad ring may include identifying the signals that correspond to the input, output, and output enable signals for the FPGA pad ring.

In one embodiment, a naming convention may be assumed for the signals that communicate between the chip core 130 and the pads, and the FPGA generation code may automatically search the modified design files 56 for the default signal names. For example, in one embodiment, signal outputs from the chip core 130 to the pad ring (e.g. out and oe) may have the prefix "core2pad_". The output enable may have the postfix "_oe". The signal inputs (e.g. in) may have the prefix "pad2core_". The pad signals (e.g. Pad) may have the prefix "pad_". If a designer uses non-default signal names, the designer may specify the non-default names in the pad ring configuration file 60.

Figures 13, 14:
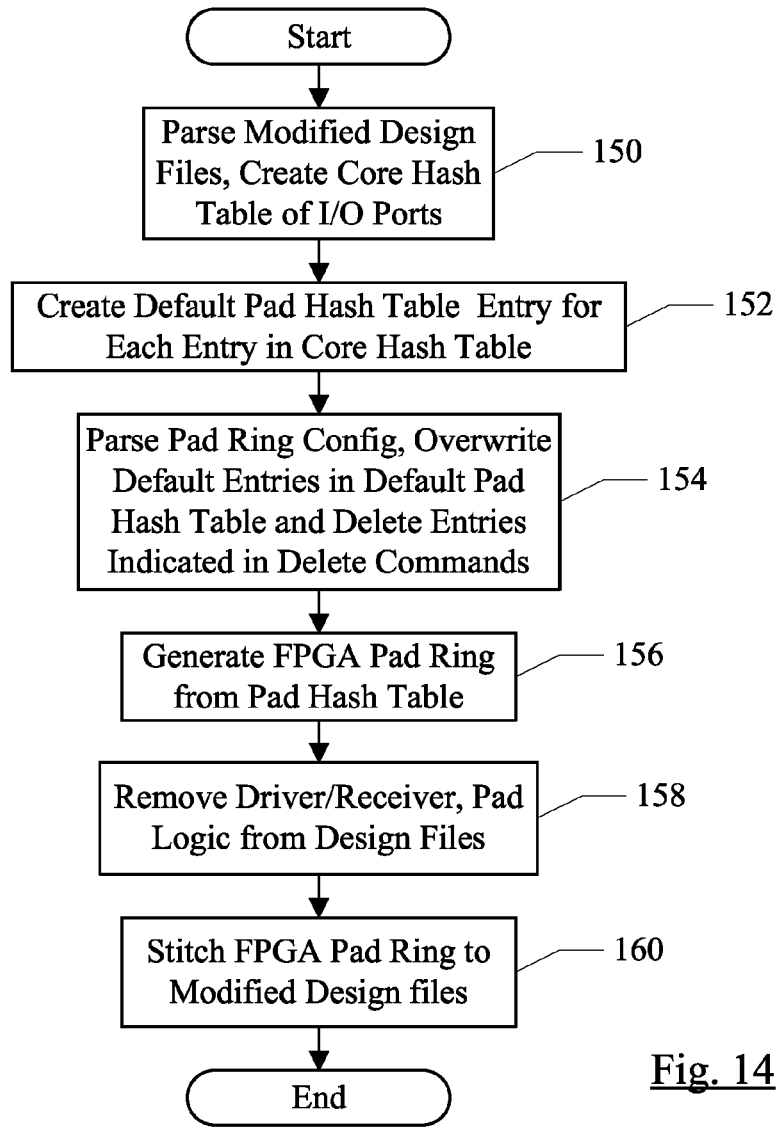
FIG. 13 is a block diagram illustrating one embodiment of a pad ring configuration file.
FIG. 14 is a flowchart illustrating operation of one embodiment of FPGA generation code to generate an FPGA pad ring.

FIG. 13 is a block diagram illustrating one embodiment of the pad ring configuration file 60. At the top of the illustrated embodiment, the general format for specifying a pad is shown. Each entry may be a comma-delimited list of items beginning with type (which may be INPUT, OUTPUT, INOUT, or DELETE in this embodiment). The INPUT, OUTPUT, and INOUT types may correspond to the input circuit, output circuit, and input/output circuit of the FPGA devices, respectively. The DELETE type may be used to delete a pin that is not used in the FPGA implementation. After the type field, the output signal ("out"), pad signal ("pad"), input signal ("in"), and output enable signal ("oe") may be listed. If a given signal is not used, e.g. the output signal for the INPUT type, then the item may be left out of the list. Alternatively, different types may have different formats in the pad ring configuration file 60. Following the list of signals, a most significant bit (msb) and least significant bit (lsb) are provided. The msb and lsb may permit the specification of a multiple bit wide signal. For single signals, the msb and lsb may both be zero.

An example of each type is shown in FIG. 13 as well. The INPUT type has no output signal, so a second comma immediately follows the first comma after INPUT in the entry, followed by a pad_name signal and an input_name signal for the pad and input signal names. There is no output enable signal, so another comma immediately follows the input_name. In this example, the input_name is a single signal, so the msb and lsb are both zero.

The OUTPUT type has an output_name output signal and a pad_name pad signal. However, the OUTPUT type has no input signal and no output enable signal, so three commas follow the pad_name signal. In this example, the output_name is a single signal, so the msb and lsb are both zero.

The INOUT type has an output_name output signal, a pad_name pad signal, an input_name input signal, and an oe_name output enable signal. In this example, the inout signal is a single signal, so the msb and lsb are both zero.

Lastly, the DELETE type lists a signal name that is to be deleted (e.g. core2pad_UART6_RSTN).

In an embodiment, one or more signals may be optional and, if not specified in the modified design files 56, the FPGA generation code may generate a default signal name according to the naming convention mentioned above. In one embodiment, the pad signal name may be optional for all three types. The input and output signal names may be optional for the input/output type as well.

Turning next to FIG. 14, a flowchart is shown illustrating operation of one embodiment of the FPGA generation code to automatically perform the pad ring generation. While the blocks are shown in a particular order in FIG. 14 for ease of understanding, other orders may be used. Blocks may be performed in parallel as well. In an embodiment, FPGA generation code may be executed on a computer to implement all or a portion of the flowchart in FIG. 14. The instructions forming the FPGA generation code (or a portion thereof that implements the flowchart of FIG. 14) may be binary instructions directly executable on one or more hardware processors of the computer, and/or may include one or more scripts that may be executed in a software environment. That is, the scripts may be commands that are interpreted by a command shell environment that performs specified operations in response to the commands. Any combination of instruction types may be used in various embodiment. The instructions, when executed, may implement the operation shown in FIG. 14.

The FPGA generation code may parse the modified design files 56, searching for the default signal names described above (block 150). The FPGA generation code may generate a core hash table of I/O ports, where the hash table may be indexed by signal name. For each port in the core hash table, the FPGA generation code may create a default pad hash table entry in a pad hash table (block 152). For input-only signals, the pad hash table entry may describe an INPUT pad type. For output-only signals, the pad hash table entry may describe an OUTPUT pad type. For bi-directional signals, the pad hash table entry may describe an INOUT pad type. The pad hash table entries may have a format similar to that shown in FIG. 13. If signal names were not found in the modified design files 56, the default signal names may be assumed according to the signal naming convention mentioned above.

The FPGA generation code may parse the pad ring configuration file 60, overwriting default entries in the pad hash table with entries specified in the pad ring configuration file 60 (block 154). In this manner, non-default signal names may overwrite the default signal names that were assumed for the ports. Additionally, the FPGA generation code may delete entries in the pad hash table that are identified in the DELETE commands in the pad ring configuration file 60 (if any). The FPGA generation code may generate the FPGA pad ring from the pad hash table (e.g. generating one INPUT, OUTPUT, or INOUT pad description for each pad in the pad hash table according to the type) (block 156). If the pad logic 134 or the driver/receiver circuitry 136 is described in the modified design files 56, the FPGA generation code may remove the corresponding description so that the pad logic 134 and the driver/receiver circuitry 136 is not programmed into the FPGA devices (block 158). The FPGA generation code may stitch the FPGA pad ring to the modified design files (block 160). Stitching the pad ring and design files may generally include attaching the same signal names to the pad ring instantiations and to the input/output signals of the design files. Accordingly, when the files are combined, the signal names may be matched to each other to create the proper connections.

Pin Muxing

Turning now to FIG. 15, a block diagram of one embodiment of time division multiplexing (TDM) logic that may be included in FPGA devices 42A-42D and a timing diagram illustrating operation of the logic is shown. The boundary of the first FPGA device (e.g. FPGA device 42A) is illustrated by the dashed line 170 in FIG. 15. That is, the circuitry to the left of the dashed line 170 may be included in the FPGA device 42A. The boundary of the second FPGA device (e.g. FPGA device 42B) is illustrated by the dashed line 172. That is, the circuitry to the right of the dashed line 172 may be included in the FPGA device 42B. Between the dashed lines 170 and 172 may be the configurable interconnect 44, and more particularly a connection between an output pin of the FPGA device 42A and an input pin of the FPGA device 42B.

As illustrated in FIG. 15, the FPGA 42A may include TDM logic 174 that is coupled to receive various output signals (e.g. O1, O2, and O3 in FIG. 14) and is further coupled to receive a TDM clock (TDM_Clk in FIG. 15). The TDM logic 174 may further be coupled to an output pin of the FPGA 42A, which is coupled to the configurable interconnect 44. Similarly, the FPGA 42B may include TDM logic 176 that is coupled to an input pin of the FPGA 42B (which is coupled to the output pin of the FPGA 42A via the configurable interconnect 44). The FPGA 42B is also coupled to receive the TDM_Clk and is configured to drive a set of input signals I1, I2, and I3. The input signals I1, I2, and I3 correspond to the output signals O1, O2, and O3, respectively. That is, the input signal I1 is logically coupled to the output signal O1; the input signal I2 is logically coupled to the output signal O2; and the input signal I3 is logically coupled to the output signal O3.

The TDM logic 174 may receive the output signals O1 to O3, which may be operated according to an FPGA clock (FPGA_Clk in the timing diagram of FIG. 15). That is, the signals O1 to O3 may be driven synchronously to the FPGA_Clk. Accordingly, once the signals O1 to O3 have stabilized for a clock cycle of the FPGA_Clk, they may remain stable until the next clock cycle of the FPGA_Clk as illustrated in FIG. 15 for O1 to O3. On the other hand, the TDM_Clk may be operating at a higher frequency than the FPGA_Clk. Particularly, the TDM_Clk may operate at a frequency that is a multiple of the FPGA_Clk frequency, where the multiple is at least as large as the maximum number of signals that may be multiplexed on a pin. In this example, the maximum number may be three. However, the maximum number may vary from embodiment to embodiment. Factors that may affect the maximum number may be the desired clock frequency for the FPGA_Clk (which may directly affect performance) versus the number of signals that need to be multiplexed to generate a workable FPGA implementation.

The TDM logic 174 may multiplex the O1 to O3 signals onto the pin according to the TDM_Clk. Accordingly, the output signals O1 to O3 travel across the interconnect 44 in one FPGA clock cycle, one signal per TDM_Clk clock cycle. The TDM logic 176 may capture the O1 to O3 signals according to the TDM_Clk clock signal and may drive the corresponding input signals I1 to I3 stably for a clock cycle of the FPGA_Clk, as partially illustrated in FIG. 15 for I1 to I3. Transmitting the signals in this fashion may overcome pin limitations of the FPGA devices while preserving the functional timing of signals according to the FPGA_Clk.

In some embodiments, the TDM logic 174 and 176 may be fixed in the FPGA devices 42A and 42B. Alternatively, the TDM logic 174 and 176 may be configured into one or more configurable logic blocks of the FPGA devices using the bitstream, similar to configuring configurable logic blocks to implement operation described in the design files.

Figure 16:
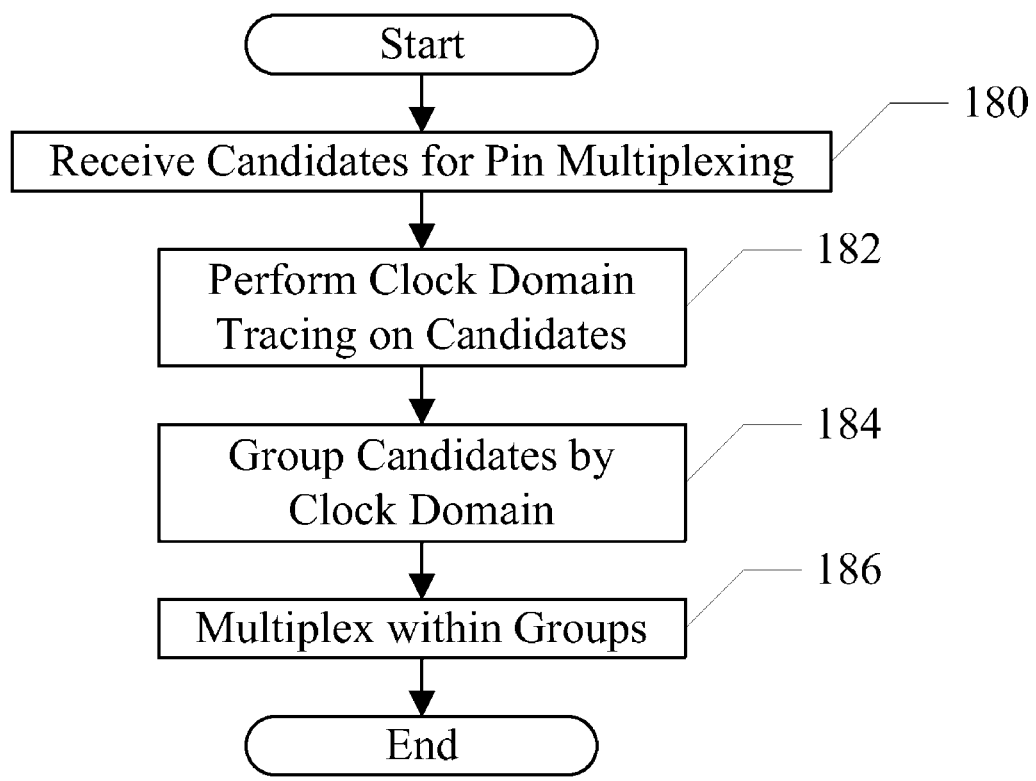
FIG. 16 is a flowchart illustrating operation of one embodiment of FPGA generation code to perform pin multiplexing.

Turning now to FIG. 16, a flowchart is shown illustrating operation of one embodiment of the FPGA generation code to automatically perform the grouping of signals for pin multiplexing. While the blocks are shown in a particular order in FIG. 16 for ease of understanding, other orders may be used. Blocks may be performed in parallel as well. In an embodiment, FPGA generation code may be executed on a computer to implement all or a portion of the flowchart in FIG. 16. The instructions forming the FPGA generation code (or a portion thereof that implements the flowchart of FIG. 16) may be binary instructions directly executable on one or more hardware processors of the computer, and/or may include one or more scripts that may be executed in a software environment. That is, the scripts may be commands that are interpreted by a command shell environment that performs specified operations in response to the commands. Any combination of instruction types may be used in various embodiment. The instructions, when executed, may implement the operation shown in FIG. 16.

In one embodiment, a commercial tool used to perform the FPGA partitioning may output a list of signals that are candidates for multiplexing and a list of signals that should not be multiplexed. The FPGA generation code may receive these candidate lists (block 180). The FPGA generation code may perform clock domain tracing on the candidate signals, identifying the clock domains for each candidate signal (block 182). The FPGA generation code may also perform clock domain tracing on the signals that are identified as non-multiplexable by the commercial tool, in some embodiments. The FPGA generation code may group the traced signals into matching clock domains (block 184), and then may multiplex signals within the groups (block 186). For example, up to a maximum number of signals from a given group may be selected to be multiplexed on each pin. Signals that do not match clock domains may not be multiplexed, in one embodiment.

The multiplexed groups of signals may be written to the pin mux file 86. In some embodiments, the FPGA generation code may also assign the mux groups to pins and write the pin assignment file 70 with data describing the pin assignment. In other embodiments, commercial FPGA tools may perform the pin assignments based on the pin mux file 86. In some embodiments, as mentioned previously, the pin mux configuration file 68 may be used to identify signals that may be excluded or included in mux groups, in addition to the candidate signals mentioned above.

Computer Accessible Storage Medium

Figure 17:
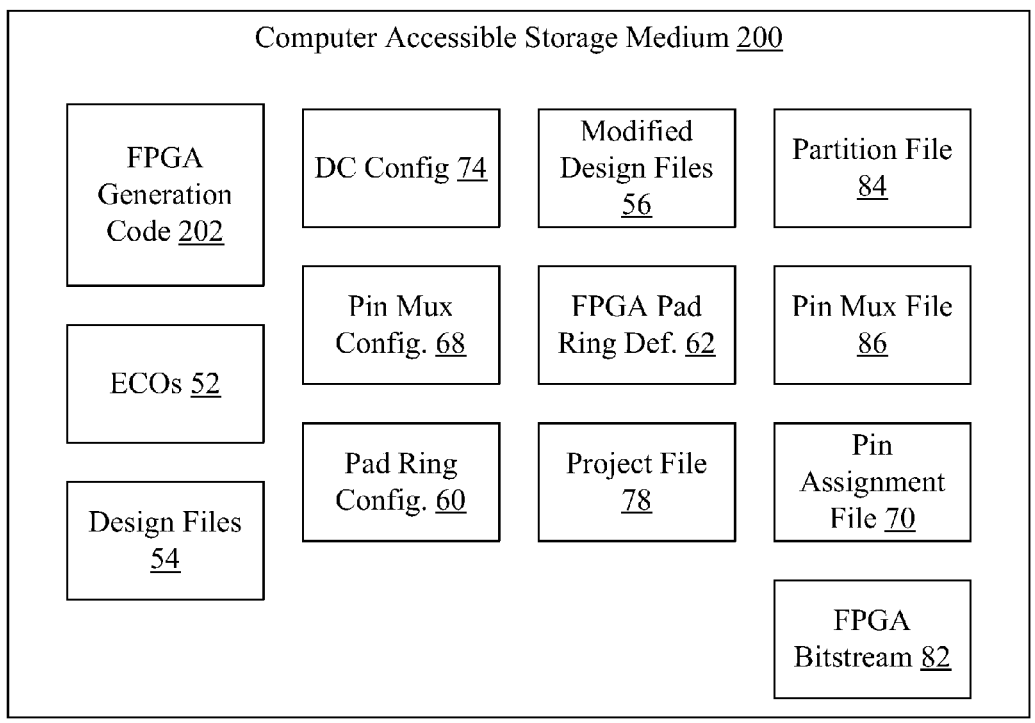
FIG. 17 is a block diagram of one embodiment of a computer accessible storage medium.

Turning next to FIG. 17, a block diagram of a computer accessible storage medium 200 is shown. Generally speaking, a computer accessible storage medium may include any storage media accessible by a computer during use to provide instructions and/or data to the computer. For example, a computer accessible storage medium may include storage media such as magnetic or optical media, e.g., disk (fixed or removable), tape, CD-ROM, DVD-ROM, CD-R, CD-RW, DVD-R, DVD-RW or Blu-Ray. Storage media may further include volatile or non-volatile memory media such as RAM (e.g. synchronous dynamic RAM (SDRAM) including double data rate (DDR, DDR2, DDR3, etc.) SDRAM and/or low power DDR (LPDDR2, etc.) SDRAM, Rambus DRAM (RDRAM), static RAM (SRAM), etc.), ROM, Flash memory, non-volatile memory such as Flash memory accessible via a peripheral interface such as the Universal Serial Bus (USB) interface, etc. Storage media may include microelectromechanical systems (MEMS), as well as storage media accessible via a communication medium such as a network and/or a wireless link. The computer accessible storage medium 200 in FIG. 17 may store the FPGA generation code 202, which may implement one or more of the flowcharts of FIGS. 4, 11, 14, and/or 16. The computer accessible storage medium 200 may also store one or more of the EDO files 52, the design files 54, the modified design files 56, the DC configuration file 74, the pad ring configuration file 60, the FPGA pad ring definition file 62, the pin mux configuration file 68, the pin mux file 86, the pin assignment file 70, the project file 78, the partition file 84, and/or the FPGA bitstream 82. Generally, the computer accessible storage medium 200 may store any set of instructions which, when executed, implement a portion or all of the flowcharts shown in FIGS. 4, 11, 14, and/or 16. A carrier medium may include computer accessible storage media as well as transmission media such as wired or wireless transmission.

Numerous variations and modifications will become apparent to those skilled in the art once the above disclosure is fully appreciated. It is intended that the following claims be interpreted to embrace all such variations and modifications.

What is claimed is:

1. A method comprising:
    executing program instructions in a computer system, wherein the program instructions execute to perform:
        identifying a plurality of pads of an integrated circuit responsive to one or more design files that describe the integrated circuit using a hardware description language (HDL);
        automatically generating a corresponding pad ring description for a programmable logic device implementation responsive to identifying the plurality of pads, the corresponding pads in the programmable logic device implementation having different associated circuitry to control signals on the pad than the circuitry associated with the plurality of pads in the integrated circuit; and
        stitching the associated circuitry for the corresponding pads of the programmable logic device implementation to the one or more design files for processing into a bitstream to be downloaded to one or more programmable logic devices.

2. The method as recited in claim 1 further comprising:
    removing driver/receiver circuitry from the one or more design files, the driver/receiver circuitry corresponding to the plurality of pads; and
    removing pad logic associated with the plurality of pads from the one or more design files.

3. The method as recited in claim 2 wherein the identifying comprises searching for default names associated with the plurality of pads.

4. The method as recited in claim 3 wherein the identifying further comprises receiving a configuration file that identifies signals associated with the plurality of pads that do not use default names, and wherein the identifying further comprises searching for the signals identified in the configuration file.

5. The method as recited in claim 4 wherein the configuration file further identifies one or more pads of the plurality of pads that are to be deleted from the programmable logic device implementation, wherein the automatically generating excludes corresponding pads for the one or more pads.

6. A non-transitory computer accessible storage medium comprising a plurality of instructions which, when executed:
    scan one or more design files that describe at least a portion of an integrated circuit using a hardware description language, wherein the scan is for one or more signal names that correspond to pads of the integrated circuit, wherein the signal names use a predefined naming convention;
    read a configuration file that specifies signals that correspond to pads but which do not use the predefined naming convention;
    scan the one or more design files for the signals specified in the configuration file;
    for each pad of the integrated circuit, determining a corresponding pad for a programmable logic device implementation of the integrated circuit; and
    writing a pad ring file for the programmable logic device implementation, the pad ring file specifying the corresponding pads.

7. The computer accessible storage medium as recited in claim 6 wherein the plurality of instructions, when executed, remove pad logic associated with each pad of the integrated circuit from the one or more design files.

8. The computer accessible storage medium as recited in claim 6 wherein the programmable logic device implementation includes an input-only pad type, and wherein determining the corresponding pad comprises selecting the input-only pad type for inputs to the integrated circuit.

9. The computer accessible storage medium as recited in claim 6 wherein the programmable logic device implementation includes an output-only pad type, and wherein determining the corresponding pad comprises selecting the output-only pad type for outputs of the integrated circuit.

10. The computer accessible storage medium as recited in claim 6 wherein the programmable logic device implementation includes an input/output pad type, and wherein determining the corresponding pad comprises selecting the input/output pad type for bidirectional input/output signals to the integrated circuit.

11. The computer accessible storage medium as recited in claim 6 further comprising stitching the pads specified in the pad ring file to the one or more design files.

12. The computer accessible storage medium as recited in claim 11 wherein the stitching comprises associating the signal names in the one or more design files that were identified as corresponding to pads with the corresponding pad description generated for the programmable logic device implementation.

* * * * *